US011532677B2

(12) United States Patent
Ye

(10) Patent No.: US 11,532,677 B2
(45) Date of Patent: Dec. 20, 2022

(54) OLED DISPLAY PANEL REDUCING PARASITIC CAPACITANCE BETWEEN COMMON ELECTRODES AND TOUCH ELECTRODES AND DISPLAY DEVICE

(71) Applicant: Wuhan China Star Optoelectronics Semiconductor Display Technology Co., Ltd., Hubei (CN)

(72) Inventor: Jian Ye, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 47 days.

(21) Appl. No.: 16/973,446

(22) PCT Filed: Jul. 27, 2020

(86) PCT No.: PCT/CN2020/104860
§ 371 (c)(1),
(2) Date: Dec. 9, 2020

(87) PCT Pub. No.: WO2022/007034
PCT Pub. Date: Jan. 13, 2022

(65) Prior Publication Data
US 2022/0190042 A1 Jun. 16, 2022

(30) Foreign Application Priority Data
Jul. 8, 2020 (CN) .......................... 202010652776.7

(51) Int. Cl.
*G06F 3/044* (2006.01)
*H01L 27/32* (2006.01)

(52) U.S. Cl.
CPC .......... *H01L 27/323* (2013.01); *G06F 3/0446* (2019.05); *H01L 27/3246* (2013.01)

(58) Field of Classification Search
CPC .. H01L 27/323; H01L 27/3246; G06F 3/0446
See application file for complete search history.

(56) References Cited

U.S. PATENT DOCUMENTS

| 2015/0325815 | A1 | 11/2015 | Kang et al. |
| 2016/0202524 | A1 | 7/2016 | Yun et al. |
| 2018/0059862 | A1* | 3/2018 | Zeng ..................... G06F 3/0443 |

FOREIGN PATENT DOCUMENTS

| CN | 106952938 | 7/2017 |
| CN | 108762571 | 11/2018 |

* cited by examiner

*Primary Examiner* — Lisa S Landis
(74) *Attorney, Agent, or Firm* — PV IP PC; Wei Te Chung; Ude Lu

(57) ABSTRACT

The present disclosure provides an organic light emitting diode (OLED) display panel and a display device. The OLED display panel includes a substrate, a driving circuit layer, a planarization layer, a luminescent functional layer, an encapsulation layer, and a touch layer including touch electrodes. The luminescent functional layer includes a pixel electrode layer, a pixel definition layer, a luminescent material layer, and a common electrode layer. The pixel definition layer is patterned to form pixel definition regions and grooves. Projections of the touch electrodes on the substrate and projections of the grooves on the substrate are at least partially overlapped, thereby improving a touch report rate of the OLED display panel.

20 Claims, 2 Drawing Sheets

OLED DISPLAY PANEL REDUCING PARASITIC CAPACITANCE BETWEEN COMMON ELECTRODES AND TOUCH ELECTRODES AND DISPLAY DEVICE

RELATED APPLICATIONS

This application is a National Phase of PCT Patent Application No. PCT/CN2020/104860 having International filing date of Jul. 27, 2020, which claims the benefit of priority of Chinese Patent Application No. 202010652776.7 filed on Jul. 8, 2020. The contents of the above applications are all incorporated by reference as if fully set forth herein in their entirety.

FIELD AND BACKGROUND OF THE INVENTION

The present disclosure relates to the field of display technologies, and particularly relates to an organic light emitting diode (OLED) display panel and a display device.

Capacitive touch screens are widely used in various electronic interactive scene devices due to their high durability, long life, and support for multi-touch functions. A working principle of the capacitive touch screens is to detect a specific position touched by a finger through detecting a capacitance change at the position touched by the finger.

At present, for flexible active-matrix organic light-emitting diode (AMOLED) on-cell (a touch layer is integrated on a cover plate of the AMOLED) display screens, touch electrodes are generally fabricated on an upper surface of a film encapsulation layer directly. However, due to the film encapsulation layer (a thickness is usually less than 10 um) being thin, a distance between the touch electrodes and a cathode is short and a parasitic capacitance between the touch electrodes and the cathode is large, making a current-limiting resistor (RC) in a touch electrode channel at a far end of a large-sized touch screen delay substantially, thereby causing a scanning frequency of the touch electrodes to drop significantly, and in turn leading to degradation of key performances such as a touch report rate.

Therefore, a problem that the touch report rate of the AMOLED on-cell display screens is low in prior art needs to be solved.

SUMMARY OF THE INVENTION

The present disclosure provides an OLED display panel and a display device to relieve the problem that the touch report rate of the AMOLED on-cell display screens is low in the prior art.

The present disclosure provides an OLED display panel, including:

a substrate;

a driving circuit layer disposed on the substrate;

a planarization layer disposed on the driving circuit layer;

a luminescent functional layer disposed on the planarization layer and including a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer;

an encapsulation layer disposed on the common electrode layer, wherein a thickness of a portion of the encapsulation layer in the grooves is greater than a thickness of a portion of the encapsulation layer outside the grooves and the pixel definition regions; and a touch layer disposed on the encapsulation layer and including touch electrodes, wherein the touch electrodes are grid structures surrounding the pixel definition regions, and projections of the touch electrodes on the substrate and projections of the grooves on the substrate are at least partially overlapped.

In the OLED display panel provided by the present disclosure, the projections of the touch electrodes on the substrate fall within the projections of the grooves on the substrate.

In the OLED display panel provided by the present disclosure, bottoms of the grooves are located in the pixel definition layer.

In the OLED display panel provided by the present disclosure, the grooves penetrate through the pixel definition layer, and bottoms of the grooves are located on an interface between the pixel definition layer and the planarization layer.

In the OLED display panel provided by the present disclosure, the grooves penetrate through the pixel definition layer, and bottoms of the grooves are located in the planarization layer.

In the OLED display panel provided by the present disclosure, the grooves simultaneously penetrate through the pixel definition layer and the planarization layer, and bottoms of the grooves are located on an interface between the planarization layer and the driving circuit layer.

In the OLED display panel provided by the present disclosure, the grooves include first groove portions and second groove portions, each of the second groove portions is disposed on a side of one of the first groove portions away from the encapsulation layer, projections of the second groove portions on the substrate fall within projections of the first groove portions on the substrate, and areas of the projections of the second groove portions on the substrate are less than areas of the projections of the first groove portions on the substrate.

In the OLED display panel provided by the present disclosure, the projections of the touch electrodes on the substrate fall within the projections of the second groove portions on the substrate.

In the OLED display panel provided by the present disclosure, the first groove portions and the second groove portions are all located in the pixel definition layer, and bottoms of the second groove portions are located in the pixel definition layer.

In the OLED display panel provided by the present disclosure, the first groove portions and the second groove portions are all located in the pixel definition layer, and bottoms of the second groove portions are located on an interface between the pixel definition layer and the planarization layer.

In the OLED display panel provided by the present disclosure, the first groove portions penetrate through the pixel definition layer, the second groove portions are located in the planarization layer, and bottoms of the second groove portions are located in the planarization layer.

In the OLED display panel provided by the present disclosure, the planarization layer includes a first planarization layer and a second planarization layer, the second planarization layer is disposed on a side of the first planarization layer away from the encapsulation layer, the first groove portions penetrate through the pixel definition layer, the second groove portions penetrate through the first planarization layer, and bottoms of the second groove portions are located on an interface between the first planarization layer and the second planarization layer.

In the OLED display panel provided by the present disclosure, the first groove portions penetrate through the pixel definition layer, the second groove portions penetrate through the planarization layer, and bottoms of the second groove portions are located on an interface between the planarization layer and the driving circuit layer.

Meanwhile, the present disclosure further provides a display device including an OLED display panel, the OLED display panel includes:

a substrate;

a driving circuit layer disposed on the substrate;

a planarization layer disposed on the driving circuit layer;

a luminescent functional layer disposed on the planarization layer and including a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer;

an encapsulation layer disposed on the common electrode layer, wherein a thickness of a portion of the encapsulation layer in the grooves is greater than a thickness of a portion of the encapsulation layer outside the grooves and the pixel definition regions; and a touch layer disposed on the encapsulation layer and including touch electrodes, wherein the touch electrodes are grid structures surrounding the pixel definition regions, and projections of the touch electrodes on the substrate and projections of the grooves on the substrate are at least partially overlapped.

In the display device provided by the present disclosure, the projections of the touch electrodes on the substrate fall within the projections of the grooves on the substrate.

In the display device provided by the present disclosure, the grooves penetrate through the pixel definition layer, and bottoms of the grooves are located on an interface between the pixel definition layer and the planarization layer.

In the display device provided by the present disclosure, the grooves simultaneously penetrate through the pixel definition layer and the planarization layer, and bottoms of the grooves are located on an interface between the planarization layer and the driving circuit layer.

In the display device provided by the present disclosure, the grooves include first groove portions and second groove portions, each of the second groove portions is disposed on a side of one of the first groove portions away from the encapsulation layer, projections of the second groove portions on the substrate fall within projections of the first groove portions on the substrate, and areas of the projections of the second groove portions on the substrate are less than areas of the projections of the first groove portions on the substrate.

In the display device provided by the present disclosure, the planarization layer includes a first planarization layer and a second planarization layer, the second planarization layer is disposed on a side of the first planarization layer away from the encapsulation layer, the first groove portions penetrate through the pixel definition layer, the second groove portions penetrate through the first planarization layer, and bottoms of the second groove portions are located on an interface between the first planarization layer and the second planarization layer.

In the display device provided by the present disclosure, the first groove portions penetrate through the pixel definition layer, the second groove portions penetrate through the planarization layer, and bottoms of the second groove portions are located on an interface between the planarization layer and the driving circuit layer.

The present disclosure provides an OLED display panel and a display device, the OLED display panel includes: a substrate; a driving circuit layer disposed on the substrate; a planarization layer disposed on the driving circuit layer; a luminescent functional layer disposed on the planarization layer and including a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer; an encapsulation layer disposed on the common electrode layer, wherein a thickness of a portion of the encapsulation layer in the grooves is greater than a thickness of a portion of the encapsulation layer outside the grooves and the pixel definition regions; and a touch layer disposed on the encapsulation layer and including touch electrodes, wherein the touch electrodes are grid structures surrounding the pixel definition regions, and projections of the touch electrodes on the substrate and projections of the grooves on the substrate are at least partially overlapped. The arrangement of the grooves in the pixel definition layer increases the distance between the common electrodes and the touch electrodes, reduces the parasitic capacitance between the common electrodes and the touch electrodes, and improves the touch report rate and a touch sensitivity of the OLED display panel.

BRIEF DESCRIPTION OF THE SEVERAL VIEWS OF THE DRAWINGS

Following describes specific implementations of the present disclosure in detail with reference to accompanying drawings, which will make the technical solutions and other beneficial effects of the present disclosure obvious.

DESCRIPTION OF SPECIFIC EMBODIMENTS OF THE INVENTION

For the problem that the touch report rate of the AMOLED on-cell display screens is low in the prior art, an OLED display panel is provided by the present disclosure to relieve the problem.

Figure 1:
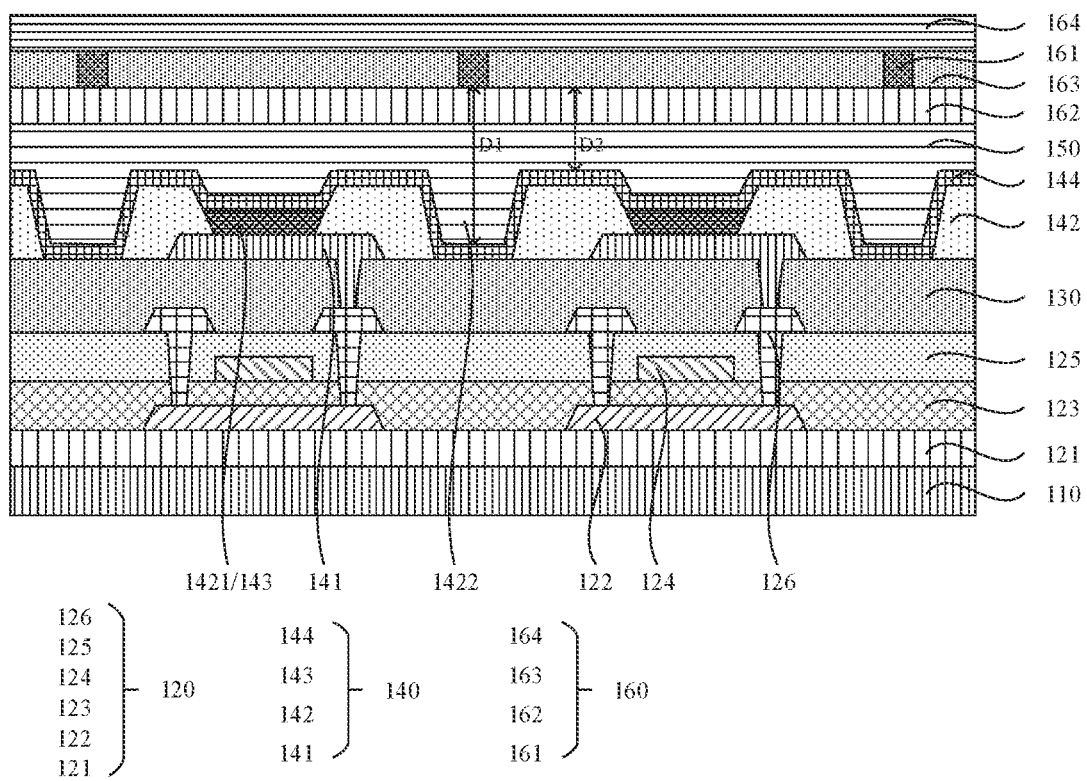
FIG. 1 is a first schematic view of an OLED display panel provided by an embodiment of the present disclosure.
Figure 2:
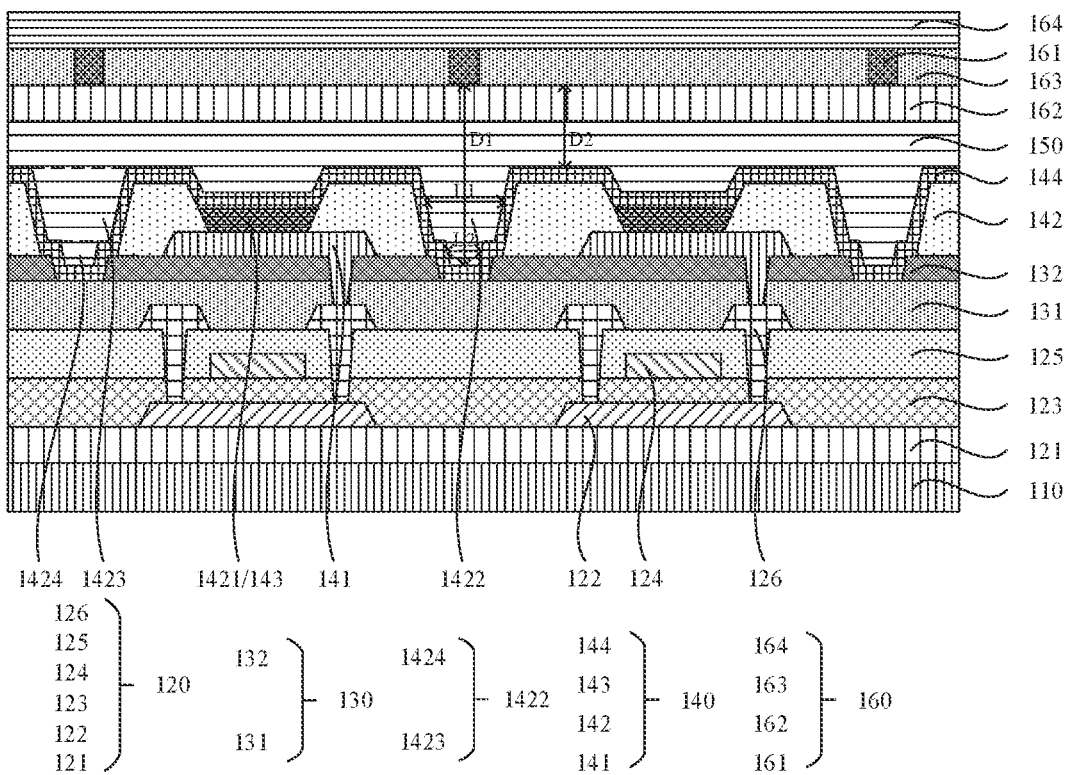
FIG. 2 is a second schematic view of the OLED display panel provided by the embodiment of the present disclosure.

In an embodiment, referring to FIG. 1 and FIG. 2, FIG. 1 and FIG. 2 are two schematic views of the OLED display panel provided by the embodiment of the present disclosure, respectively. As shown in the figures, the OLED display panel provided in the embodiment of the present disclosure includes:

a substrate 110;

a driving circuit layer 120 disposed on the substrate 110;

a planarization layer 130 disposed on the driving circuit layer 120;

a luminescent functional layer 140 disposed on the planarization layer 130 and including a pixel electrode layer 141, a pixel definition layer 142, a luminescent material layer 143, and a common electrode layer 144 sequentially arranged in a direction away from the substrate 110, wherein the pixel electrode layer 141 is patterned to form pixel electrodes 141, the pixel definition layer 142 is patterned to form pixel definition regions 1421 and grooves 1422, each of the grooves 1422 is defined between adjacent at least two of the pixel definition regions 1421, the pixel definition regions 1421 correspond to the pixel electrodes 141, the luminescent material layer 143 is disposed in the pixel definition regions 1421, and the common electrode layer 144 is evenly arranged on the pixel definition layer 142 and the luminescent material layer 143;

an encapsulation layer 150 disposed on the common electrode layer 144, wherein a thickness of a portion of the encapsulation layer 150 in the grooves 1422 is greater than a thickness of a portion of the encapsulation layer 150 outside the grooves 1422 and the pixel definition regions 1421; and a touch layer 160 disposed on the encapsulation layer 150 and including touch electrodes 161, wherein the touch electrodes 161 are grid structures surrounding the pixel definition regions 1421, and projections of the touch electrodes 161 on the substrate and projections of the grooves 1422 on the substrate 110 are at least partially overlapped.

In the OLED display panel provided in the embodiment, the pixel definition layer is patterned to define the pixel definition regions and the grooves, each of the grooves is defined between adjacent at least two of the pixel definition regions, the projections of the grooves on the substrate and the projections of the touch electrodes on the substrate are at least partially overlapped, and a thickness of a portion of the encapsulation layer in the grooves is greater than a thickness of a portion of the encapsulation layer outside the grooves, which increases the distance between the common electrodes and the touch electrodes, reduces the parasitic capacitance between the common electrodes and the touch electrodes, and improves the touch report rate and a touch sensitivity of the OLED display panel.

For specific structures of the OLED display panel provided in the embodiment of the present disclosure, please refer to FIG. 1 and FIG. 2, wherein, the substrate 110 generally includes a rigid substrate and a flexible substrate. The rigid substrate is generally a glass substrate. The flexible substrate generally includes a first organic substrate, an inorganic substrate, and a second organic substrate. The first organic substrate and the second organic substrate are configured to realize a flexible performance of the OLED display panel, and the inorganic substrate is configured to maintain a supporting performance of the flexible substrate and to prevent water and oxygen outside the OLED display panel from entering the OLED display panel.

The driving circuit layer 120 is disposed on the substrate 110. The driving circuit layer 120 includes thin film transistors arranged in an array and metal lines. The thin film transistors are connected with the metal lines to jointly constitute a driving circuit of the OLED display panel for driving the luminescent functional layer 140 for luminous display. The driving circuit layer 120 includes a first buffer layer 121, a semiconductor active layer 122, a first insulation layer 123, a gate metal layer 124, a second insulation layer 125, and a source-drain electrode layer 126 successively stacked on the substrate 110. The semiconductor active layer 122 is patterned to form channels of the thin film transistors, the gate metal layer 124 is patterned to form gate electrodes of the thin film transistors and scan lines of the driving circuit, and the source-drain electrode layer 126 is patterned to form source electrodes of the thin film transistors and data lines and source lines of the driving circuit. In the embodiment shown in FIG. 1 and FIG. 2, the thin film transistor is a thin film transistor having a top-gate structures; in other embodiments, the thin film transistor may also be a thin film transistor having a bottom-gate structure. In the embodiment shown in FIG. 1 and FIG. 2, the thin film transistor is a thin film transistor having a single-gate structure, and in other embodiments, the thin film transistor may also be a double-gate or a tri-gate thin-film transistor, which is not limited herein.

The planarization layer 130 is disposed on the driving circuit layer 120 and is configured to planarize the driving circuit layer 120 to provide a flat base for a preparation of the pixel electrode layer 141. a material of the planarization layer 130 is generally an organic material.

The luminescent functional layer 140 includes the pixel electrode layer 141, the pixel definition layer 142, the luminescent material layer 143, and the common electrode layer 144 sequentially arranged in a direction away from the substrate 110. The pixel electrode layer 141 is patterned to form the pixel electrodes 141. The pixel definition layer 142 is patterned to form the pixel definition regions 1421 and grooves 1422. Each of the grooves 1422 is defined between adjacent at least two of the pixel definition regions 1421. The pixel definition regions 1421 correspond to the pixel electrodes 141, are disposed on the pixel electrodes 141, and expose the pixel electrodes 141. The luminescent material layer 143 is disposed in the pixel definition regions 1421 to contact with the pixel electrodes 141. The common electrode layer 144 is evenly arranged on the pixel definition layer 142 and the luminescent material layer 143 and is deposited on sides and bottoms of the grooves 1422.

The encapsulation layer 150 is disposed on the common electrode layer 144 to encapsulate the OLED display panel, so as to prevent water and oxygen outside from entering the luminescent functional layer 140. The encapsulation layer 150 generally includes a first inorganic layer, a second inorganic layer, and an organic layer between the first inorganic layer and the second inorganic layer. As shown in FIG. 1 and FIG. 2, a thickness of a portion of the encapsulation layer 150 in the grooves 1422 is greater than a thickness of a portion of the encapsulation layer 150 outside the grooves 1422 and the pixel definition regions 1421.

The touch layer 160 is disposed on the encapsulation layer 150 and includes a second buffer layer 162, the touch electrodes 161, an insulating layer 163, and a passivation layer 164 arranged in a direction away from the encapsulation layer.

Figure 3:
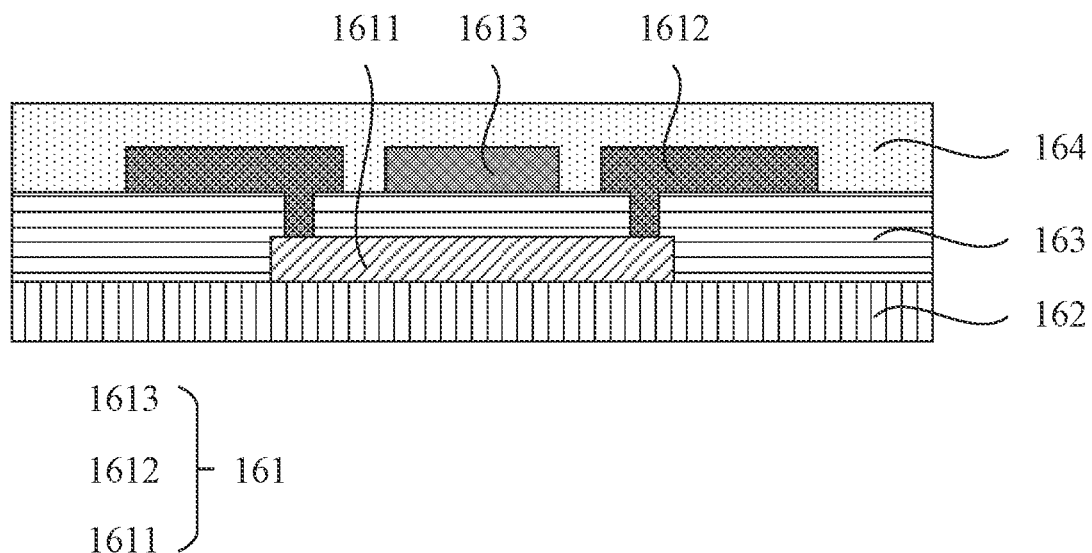
FIG. 3 is a schematic view of a touch layer provided by the embodiment of the present disclosure.

Please specifically refer to FIG. 3, FIG. 3 shows a schematic view of the touch layer provided by the embodiment of the present disclosure. As shown in FIG. 3, the touch layer 160 includes the second buffer layer 162, bridge electrodes 1611 disposed on the second buffer layer 162, the insulating layer 163 covering the bridge electrodes 1611, and first touch electrodes 1612 disposed on the insulating layer 163, second touch electrodes 1613 disposed on the insulating layer 163, and the passivation layer 164 covering the first touch electrodes 1612 and the second touch electrodes 1613. Adjacent first touch electrodes 1612 are connected to a same bridge electrode 1611 through via holes. It can be said that the first touch electrodes 1612 are touch driving electrodes and the second touch electrodes 1613 are touch sensing electrodes, or the first touch electrodes 1612 are touch sensing electrodes and the second touch electrodes 1613 are touch driving electrodes.

Figure 4:
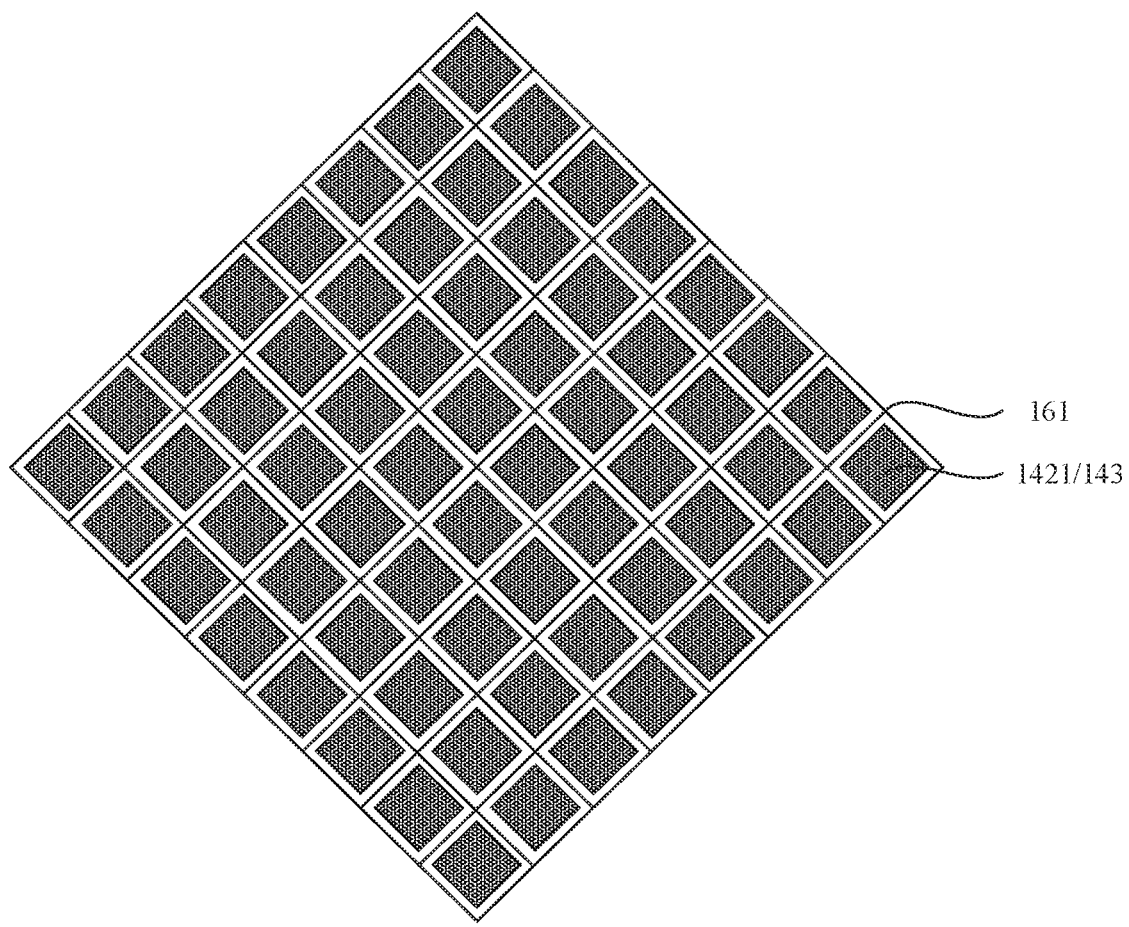
FIG. 4 is a schematic view of a plane structure of touch electrodes provided by the embodiment of the present disclosure.

Please specifically refer to FIG. 4, FIG. 4 shows a schematic view of a plane structure of the touch electrodes provided by the embodiment of the present disclosure. As shown in FIG. 4, the touch electrodes 161 are grid structures. The touch electrodes 161 are wired around subpixels. Area bounded by grid lines correspond to a position where the luminescent material layer 143 is located. That is, the grid lines of the touch electrodes 161 are located between adjacent pixel definition regions 1421 and are disposed around the pixel definition regions 1421. The grooves 1422 are also defined between adjacent pixel definition regions 1421. Projections of the touch electrodes 161 on the substrate 110 and projections of the grooves 1422 on the substrate 110 are at least partially overlapped. Furthermore, as shown in FIG. 1 and FIG. 2, the projections of the touch electrodes 161 on the substrate 110 fall within the projections of the grooves 1422 on the substrate 110.

At the grooves 1422, the common electrode layer 144 is formed at the sides and bottoms of the grooves, and the touch electrodes 161 are formed directly above the grooves 1422. Thus, a distance D1 between the touch electrode 161 and the common electrode 144 directly below the touch electrode 161 is larger than a distance D2 between the touch electrode 161 and the common electrode 144 directly below the touch electrode 161 without setting the grooves 1422. The grooves 1422 are disposed in the pixel definition layer 142 and at a position directly below the touch electrodes 161, and the common electrodes 144 are formed on the bottoms of the grooves 1422, thereby increasing the distance between the touch electrodes 161 and the common electrodes 144, reducing the parasitic capacitance between the common electrodes 144 and the touch electrodes 161, and improving the touch report rate and the touch sensitivity of the OLED display panel.

Depths of the grooves 1422 are different, the distances between the touch electrodes 161 and the common electrodes 144 are different, the parasitic capacitances between the touch electrodes 161 and the common electrodes 144 are different, and the touch report rate and the touch sensitivity of the OLED display panel will be different.

In a first embodiment, the grooves 1422 are located in the pixel definition layer 142, and the bottoms of the grooves 1422 are positioned in the pixel definition layer 142. Compared with the prior art, the embodiment increases the distance between the touch electrodes 161 and the common electrodes 144, and the increased distance is the distance between the bottoms of the grooves 1422 and the upper surface of the pixel definition layer 142, the embodiment reduces the parasitic capacitance between the common electrodes 144 and the touch electrodes 161 and improves the touch report rate and the touch sensitivity of the OLED display panel.

In a second embodiment, as shown in FIG. 1, the grooves 1422 penetrate through the pixel definition layer 142, and the bottoms of the grooves 1422 are located on an interface between the pixel definition layer 142 and the planarization layer 130. Compared with the first embodiment, the embodiment further increases the distance between the touch electrodes 161 and the common electrodes 144, and the increased distance is a thickness of the pixel definition layer 142, the embodiment further reduces the parasitic capacitance between the common electrodes 144 and the touch electrodes 161 and improves the touch report rate and the touch sensitivity of the OLED display panel.

In a third embodiment, the grooves 1422 penetrate through the pixel definition layer 142, and the bottoms of the grooves 1422 are located in the planarization layer 130. Compared with the second embodiment, the embodiment further increases the distance between the touch electrodes 161 and the common electrodes 144, and the increased distance is a distance between the bottom of the grooves 1422 and the upper surface of the pixel definition layer 142, the embodiment further reduces the parasitic capacitance between the common electrodes 144 and the touch electrodes 161 and improves the touch report rate and the touch sensitivity of the OLED display panel.

In a fourth embodiment, the grooves 1422 simultaneously penetrate through the pixel definition layer 142 and the planarization layer 130, and the bottoms of the grooves 1422 are located on an interface between the planarization layer 130 and the driving circuit layer 120. Compared with the third embodiment, the embodiment further increases the distance between the touch electrodes 161 and the common electrodes 144, and the increased distance is a total thickness of the pixel definition layer 142 and the planarization layer 130, the embodiment further reduces the parasitic capacitance between the common electrodes 144 and the touch electrodes 161 and improves the touch report rate and the touch sensitivity of the OLED display panel.

In a fifth embodiment, as shown in FIG. 2, the groove 1422 includes a first groove portion 1423 and a second groove portion 1424. The second groove portion 1424 is disposed on a side of the first groove portion 1423 away from the encapsulation layer 150. A projection of the second groove portion 1424 on the substrate 110 fall within a projection of the first groove portion 1423 on the substrate 110, and an area of the projection of the second groove portion 1424 on the substrate 110 is less than an area of the projection of the first groove portion 1423 on the substrate 110. That is, a lateral opening L1 of the first groove portion 1423 is larger than a lateral opening L2 of the second groove portion 1424.

Under a condition that the depth of the groove 1422 is certain and a side inclination angle of the groove 1422 is certain, the arrangement of the first groove portion 1423 and the second groove portion 1424 provides a transition ladder for deposition of the common electrode 144 at the side of the groove, thereby preventing a breaking risk of the common electrode 144 at the side of the groove 1422 due to the excessive depth of the groove 1422 or the excessive tilt angle of the side of the groove 1422.

The first groove portions 1423 and the second groove portions 1424 are all located in the pixel definition layer 142, and the bottoms of the second groove portions 1424 are located in the pixel definition layer 142. Compared with the first embodiment, the embodiment also increases the distance between the touch electrodes 161 and the common electrodes 144, and the increased distance is the distance between the bottoms of the grooves 1422 and the upper surface of the pixel definition layer 142, the embodiment reduces the parasitic capacitance between the common electrodes 144 and the touch electrodes 161 and improves the touch report rate and the touch sensitivity of the OLED display panel. Meanwhile, the embodiment prevents the breaking risk of the common electrodes 144 at the sides of the grooves 1422 due to the excessive depth of the grooves 1422 or the excessive tilt angle of the sides of the grooves 1422.

In a sixth embodiment, the first groove portions 1423 and the second groove portions 1424 are all located in the pixel definition layer 142, and the bottoms of the second groove portions 1424 are located on an interface between the pixel definition layer 142 and the planarization layer 130. Compared with the fifth embodiment, the embodiment further increases the distance between the touch electrodes 161 and the common electrodes 144, and the increased distance is the thickness of the pixel definition layer 142, the embodiment further reduces the parasitic capacitance between the common electrodes 144 and the touch electrodes 161 and improves the touch report rate and the touch sensitivity of the OLED display panel.

In a seventh embodiment, the first groove portions 1423 penetrate through the pixel definition layer 142, the second groove portions 1424 are located in the planarization layer 130, and the bottoms of the second groove portions 1424 are located in the planarization layer 130. Compared with the sixth embodiment, the embodiment further increases the distance between the touch electrodes 161 and the common electrodes 144, and the increased distance is the distance between the bottoms of the second groove portions 1424 and the upper surface of the pixel definition layer 142, the embodiment further reduces the parasitic capacitance between the common electrodes 144 and the touch electrodes 161 and improves the touch report rate and the touch sensitivity of the OLED display panel.

In an eighth embodiment, the first groove portions 1423 penetrate through the pixel definition layer 142, the second groove portions 1424 penetrate through the planarization layer 130, and the bottoms of the second groove portions 1424 are located on an interface between the planarization layer 130 and the driving circuit layer 120. Compared with the seventh embodiment, the embodiment further increases the distance between the touch electrodes 161 and the common electrodes 144, and the increased distance is the total thickness of the pixel definition layer 142 and the planarization layer 130, the embodiment further reduces the parasitic capacitance between the common electrodes 144 and the touch electrodes 161 and improves the touch report rate and the touch sensitivity of the OLED display panel.

In a ninth embodiment, the planarization layer 130 includes a first planarization layer 131 and a second planarization layer 132, the second planarization layer 132 is disposed on a side of the first planarization layer 131 away from the encapsulation layer 150, the first groove portions 1423 penetrate through the pixel definition layer 142, the second groove portions 1424 penetrate through the first planarization layer 131, and the bottoms of the second groove portions 1424 are located on an interface between the first planarization layer 131 and the second planarization layer 132.

Because the planarization layer 130 covers the source-drain electrode layer 126 and metal circuits on the source-drain electrode layer 126 are relatively dense, when the bottoms of the grooves 1422 are located at the interface between the planarization layer 130 and the driving circuit layer 120, there is a risk that the common electrodes 144 will be short-connected to the metal circuits on the source-drain electrode layer 126. Compared with the ninth embodiment, in the embodiment, the bottoms of the second groove portions 1424 are located at the interface between the first planarization layer 131 and the second planarization layer 132, the common electrodes 144 are deposited on an upper surface of the second planarization layer 132, thereby preventing the risk of short connection between the common electrodes 144 and the metal circuits on the source-drain electrode layer 126.

Meanwhile, the present disclosure further provides a display device. The display device includes the OLED display panel provided by the embodiments of the present disclosure. The OLED display panel includes:

a substrate;

a driving circuit layer disposed on the substrate;

a planarization layer disposed on the driving circuit layer;

a luminescent functional layer disposed on the planarization layer and including a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer;

an encapsulation layer disposed on the common electrode layer, wherein a thickness of a portion of the encapsulation layer in the grooves is greater than a thickness of a portion of the encapsulation layer outside the grooves and the pixel definition regions; and a touch layer disposed on the encapsulation layer and including touch electrodes, wherein the touch electrodes are grid structures surrounding the pixel definition regions, and projections of the touch electrodes on the substrate and projections of the grooves on the substrate are at least partially overlapped.

The embodiment provides a display device and the display device includes the OLED display panel provided by the embodiments of the present disclosure. In the OLED display panel provided in the embodiment, the pixel definition layer is patterned to define the pixel definition regions and the grooves, each of the grooves is defined between adjacent at least two of the pixel definition regions, the projections of the grooves on the substrate and the projections of the touch electrodes on the substrate are at least partially overlapped, and a thickness of a portion of the encapsulation layer in the grooves is greater than a thickness of a portion of the encapsulation layer outside the grooves, which increases the distance between the common electrodes and the touch electrodes, reduces the parasitic capacitance between the common electrodes and the touch electrodes, and improves the touch report rate and a touch sensitivity of the OLED display panel.

In an embodiment, the projections of the touch electrodes on the substrate fall within the projections of the grooves on the substrate.

In an embodiment, the bottoms of the grooves are located in the pixel definition layer.

In an embodiment, the grooves penetrate through the pixel definition layer, and the bottoms of the grooves are located on an interface between the pixel definition layer and the planarization layer.

In an embodiment, wherein the grooves penetrate through the pixel definition layer, and the bottoms of the grooves are located in the planarization layer.

In an embodiment, the grooves simultaneously penetrate through the pixel definition layer and the planarization layer, and the bottoms of the grooves are located on an interface between the planarization layer and the driving circuit layer.

In an embodiment, the grooves include first groove portions and second groove portions, each of the second groove portions is disposed on a side of one of the first groove portions away from the encapsulation layer, projections of the second groove portions on the substrate fall within projections of the first groove portions on the substrate, and areas of the projections of the second groove portions on the substrate are less than areas of the projections of the first groove portions on the substrate.

In an embodiment, projections of the touch electrodes on the substrate fall within the projections of the second groove portions on the substrate.

In an embodiment, the first groove portions and the second groove portions are all located in the pixel definition layer, and bottoms of the second groove portions are located in the pixel definition layer.

In an embodiment, the first groove portions and the second groove portions are all located in the pixel definition layer, and the bottoms of the second groove portions are located on an interface between the pixel definition layer and the planarization layer.

In an embodiment, the first groove portions penetrate through the pixel definition layer, the second groove portions are located in the planarization layer, and the bottoms of the second groove portions are located in the planarization layer.

In an embodiment, the planarization layer includes a first planarization layer and a second planarization layer, the second planarization layer is disposed on a side of the first planarization layer away from the encapsulation layer, the first groove portions penetrate through the pixel definition layer, the second groove portions penetrate through the first planarization layer, and the bottoms of the second groove portions are located on an interface between the first planarization layer and the second planarization layer.

In an embodiment, the first groove portions penetrate through the pixel definition layer, the second groove portions penetrate through the planarization layer, and the bottoms of the second groove portions are located on an interface between the planarization layer and the driving circuit layer.

It can be seen from the above embodiments that:

Embodiments of the present disclosure provide an OLED display panel and a display device. The OLED display panel includes: a substrate; a driving circuit layer disposed on the substrate; a planarization layer disposed on the driving circuit layer; a luminescent functional layer disposed on the planarization layer and including a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer; an encapsulation layer disposed on the common electrode layer, wherein a thickness of a portion of the encapsulation layer in the grooves is greater than a thickness of a portion of the encapsulation layer outside the grooves and the pixel definition regions; and a touch layer disposed on the encapsulation layer and including touch electrodes, wherein the touch electrodes are grid structures surrounding the pixel definition regions, and projections of the touch electrodes on the substrate and projections of the grooves on the substrate are at least partially overlapped. The arrangement of the grooves in the pixel definition layer increases the distance between the common electrodes and the touch electrodes, reduces the parasitic capacitance between the common electrodes and the touch electrodes, and improves the touch report rate and a touch sensitivity of the OLED display panel.

In summary, although the present disclosure has been disclosed in preferred embodiments, the above-mentioned preferred embodiments are not intended to limit the present disclosure. Those of ordinary skill in the art, without departing from the spirit and scope of the present disclosure, all various changes and modifications can be made. Therefore, the protection scope of the present disclosure is subject to the scope defined by the claims.

What is claimed is:

1. An organic light emitting diode (OLED) display panel, comprising:
   a substrate;
   a driving circuit layer disposed on the substrate;
   a planarization layer disposed on the driving circuit layer;
   a luminescent functional layer disposed on the planarization layer and comprising a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer, and the common electrode layer is further deposited on sides and bottoms of the grooves;
   an encapsulation layer disposed on the common electrode layer, wherein a thickness of a portion of the encapsulation layer in the grooves is greater than a thickness of a portion of the encapsulation layer outside the grooves and the pixel definition regions; and
   a touch layer disposed on the encapsulation layer and comprising touch electrodes, wherein the touch electrodes are grid structures surrounding the pixel definition regions, and projections of the touch electrodes on the substrate and projections of the grooves on the substrate are at least partially overlapped.

2. The OLED display panel in claim 1, wherein the projections of the touch electrodes on the substrate fall within the projections of the grooves on the substrate.

3. The OLED display panel in claim 1, wherein bottoms of the grooves are located in the pixel definition layer.

4. The OLED display panel in claim 1, wherein the grooves penetrate through the pixel definition layer, and bottoms of the grooves are located on an interface between the pixel definition layer and the planarization layer.

5. The OLED display panel in claim 1, wherein the grooves penetrate through the pixel definition layer, and bottoms of the grooves are located in the planarization layer.

6. The OLED display panel in claim 1, wherein the grooves simultaneously penetrate through the pixel definition layer and the planarization layer, and bottoms of the grooves are located on an interface between the planarization layer and the driving circuit layer.

7. The OLED display panel in claim 1, wherein the grooves comprise first groove portions and second groove portions, each of the second groove portions is disposed on a side of one of the first groove portions away from the encapsulation layer, projections of the second groove portions on the substrate fall within projections of the first groove portions on the substrate, and areas of the projections of the second groove portions on the substrate are less than areas of the projections of the first groove portions on the substrate.

8. The OLED display panel in claim 7, wherein the projections of the touch electrodes on the substrate fall within the projections of the second groove portions on the substrate.

9. The OLED display panel in claim 8, wherein the first groove portions and the second groove portions are all located in the pixel definition layer, and bottoms of the second groove portions are located in the pixel definition layer.

10. The OLED display panel in claim 8, wherein the first groove portions and the second groove portions are all located in the pixel definition layer, and bottoms of the second groove portions are located on an interface between the pixel definition layer and the planarization layer.

11. The OLED display panel in claim 8, wherein the first groove portions penetrate through the pixel definition layer, the second groove portions are located in the planarization layer, and bottoms of the second groove portions are located in the planarization layer.

12. The OLED display panel in claim 11, wherein the planarization layer comprises a first planarization layer and a second planarization layer, the second planarization layer is disposed on a side of the first planarization layer away from the encapsulation layer, the first groove portions penetrate through the pixel definition layer, the second groove portions penetrate through the first planarization layer, and bottoms of the second groove portions are located on an interface between the first planarization layer and the second planarization layer.

13. The OLED display panel in claim 8, wherein the first groove portions penetrate through the pixel definition layer, the second groove portions penetrate through the planarization layer, and bottoms of the second groove portions are located on an interface between the planarization layer and the driving circuit layer.

14. A display device, comprising an OLED display panel, the OLED display panel comprising:
a substrate;
a driving circuit layer disposed on the substrate;
a planarization layer disposed on the driving circuit layer;
a luminescent functional layer disposed on the planarization layer and comprising a pixel electrode layer, a pixel definition layer, a luminescent material layer, and a common electrode layer sequentially arranged in a direction away from the substrate, wherein the pixel electrode layer is patterned to form pixel electrodes, the pixel definition layer is patterned to form pixel definition regions and grooves, each of the grooves is defined between adjacent at least two of the pixel definition regions, the pixel definition regions correspond to the pixel electrodes, the luminescent material layer is disposed in the pixel definition regions, and the common electrode layer is evenly arranged on the pixel definition layer and the luminescent material layer, and the common electrode layer is further deposited on sides and bottoms of the grooves;
an encapsulation layer disposed on the common electrode layer, wherein a thickness of a portion of the encapsulation layer in the grooves is greater than a thickness of a portion of the encapsulation layer outside the grooves and the pixel definition regions; and
a touch layer disposed on the encapsulation layer and comprising touch electrodes, wherein the touch electrodes are grid structures surrounding the pixel definition regions, and projections of the touch electrodes on the substrate and projections of the grooves on the substrate are at least partially overlapped.

15. The display device in claim 14, wherein the projections of the touch electrodes on the substrate fall within the projections of the grooves on the substrate.

16. The display device in claim 14, wherein the grooves penetrate through the pixel definition layer, and bottoms of the grooves are located on an interface between the pixel definition layer and the planarization layer.

17. The display device in claim 14, wherein the grooves simultaneously penetrate through the pixel definition layer and the planarization layer, and bottoms of the grooves are located on an interface between the planarization layer and the driving circuit layer.

18. The display device in claim 14, wherein the grooves comprise first groove portions and second groove portions, each of the second groove portions is disposed on a side of one of the first groove portions away from the encapsulation layer, projections of the second groove portions on the substrate fall within projections of the first groove portions on the substrate, and areas of the projections of the second groove portions on the substrate are less than areas of the projections of the first groove portions on the substrate.

19. The display device in claim 18, wherein the planarization layer comprises a first planarization layer and a second planarization layer, the second planarization layer is disposed on a side of the first planarization layer away from the encapsulation layer, the first groove portions penetrate through the pixel definition layer, the second groove portions penetrate through the first planarization layer, and bottoms of the second groove portions are located on an interface between the first planarization layer and the second planarization layer.

20. The display device in claim 18, wherein the first groove portions penetrate through the pixel definition layer, the second groove portions penetrate through the planarization layer, and bottoms of the second groove portions are located on an interface between the planarization layer and the driving circuit layer.

* * * * *